(12) United States Patent
Isenberger

(10) Patent No.: US 7,407,819 B2
(45) Date of Patent: Aug. 5, 2008

(54) POLYMER MEMORY HAVING A FERROELECTRIC POLYMER MEMORY MATERIAL WITH CELL SIZES THAT ARE ASYMMETRIC

(75) Inventor: Mark S. Isenberger, Corrales, NM (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/436,209

(22) Filed: May 17, 2006

(65) Prior Publication Data

US 2006/0208297 A1 Sep. 21, 2006

Related U.S. Application Data

(62) Division of application No. 10/648,538, filed on Aug. 25, 2003, now Pat. No. 7,084,446.

(51) Int. Cl.
*H01L 21/82* (2006.01)
*H01L 31/119* (2006.01)

(52) U.S. Cl. .................. 438/3; 438/128; 438/240; 438/780; 257/209; 257/295; 257/E21.002; 257/E21.208; 365/158; 365/185.13

(58) Field of Classification Search .......... 438/3, 438/128; 257/295

See application file for complete search history.

(56) References Cited

U.S. PATENT DOCUMENTS

| | | | |
|---|---|---|---|
| 5,691,551 A * | 11/1997 | Eimori | 257/303 |
| 6,004,825 A | 12/1999 | Seyyedy | |
| 6,034,882 A * | 3/2000 | Johnson et al. | 365/103 |
| 6,356,477 B1 * | 3/2002 | Tran | 365/158 |
| 6,424,553 B2 * | 7/2002 | Berggren et al. | 365/51 |
| 6,683,802 B2 * | 1/2004 | Katoh | 365/145 |
| 6,822,890 B2 * | 11/2004 | Torjussen et al. | 365/145 |
| 6,858,862 B2 * | 2/2005 | Li et al. | 257/10 |
| 2004/0214351 A1 * | 10/2004 | Agarwal et al. | 438/3 |
| 2004/0256649 A1 * | 12/2004 | Andideh | 257/295 |
| 2005/0174875 A1 * | 8/2005 | Katoh | 365/232 |

FOREIGN PATENT DOCUMENTS

WO    WO 92/19564    11/1992

* cited by examiner

*Primary Examiner*—Dao H Nguyen
(74) *Attorney, Agent, or Firm*—Blakely, Sokoloff, Taylor & Zafman LLP

(57) ABSTRACT

A polymer memory and its method of manufacture are provided. One multi-layer construction of the polymer memory has two sets of word lines and a set of bit lines between the word lines. The word lines of each set of word lines have center lines that are spaced by a first distance from one another, and the bit lines have center lines spaced by a second distance from one another, the second distance being less than the first distance. Three masking steps are required to manufacture the three layers of lines. Older-technology machinery and masks are used to form the two layers of word lines, and new-technology machinery and masks are used to manufacture the bit lines.

5 Claims, 5 Drawing Sheets

POLYMER MEMORY HAVING A FERROELECTRIC POLYMER MEMORY MATERIAL WITH CELL SIZES THAT ARE ASYMMETRIC

CROSS-REFERENCE TO OTHER APPLICATIONS

This is a divisional of U.S. patent application Ser. No. 10/648,538, filed on Aug. 25, 2003, now U.S. Pat. No. 7,084,446.

BACKGROUND OF THE INVENTION

1). Field of the Invention

This invention relates to a polymer memory of the kind having a ferroelectric polymer memory material, and to its method of manufacture.

2). Discussion of Related Art

A polymer memory typically has a plurality of conductive word lines extending parallel to one another in an x-direction, and a plurality of bit lines extending parallel to one another in a y-direction, such that an array of cells is created, each cell being where a respective word line crosses over a respective bit line. Information can be written to or be read from one of the cells by selecting the word and bit lines that cross over the cell, and then providing a voltage to or sensing a current from one of the word or bit lines. A ferroelectric polymer memory material may, for example, space the word lines from the bit lines and may have its conductivity change at select cells by applying a select voltage over respective word and bit lines crossing over the select cells.

As computers require more memory, the need exists to include a larger number of cells in a given area, thus necessitating the need for equipment upgrades from one generation of polymer memory to the next. Some polymer memories have a total of 12 layers of metal lines, with 8 layers of ferroelectric polymer memory material between the layers of metal lines. The traditional belief has been that tooling has to be upgraded in order to photolithographically form all 12 layers of metal lines. This can lead to an equipment upgrade ratio of 40% or more, which is generally regarded as being too high when transitioning from one memory product to the next.

BRIEF DESCRIPTION OF THE DRAWINGS

The invention is described by way of example with reference to the accompanying drawings, wherein:

FIGS. 4A-D represent how each one of the polymer memory cells is written to or read from.

DETAILED DESCRIPTION OF THE INVENTION

In the following description, the terms "word lines" and "bit lines" are used to differentiate conductive lines running lengthwise from conductive lines running widthwise. The intention is not to provide any logic connotation to these terms. These terms can, for example, be swapped so that the word lines are called bit lines and the bit lines are called word lines, without departing from the scope of the invention. Furthermore, terms such as "x-direction," "y-direction," "z-direction," and "x/y planes" are used herein. These terms are used for purposes of defining structures relative to one another, and should not be used to limit the structures to any absolute frame of reference. Furthermore, although the x-, y-, and z-directions are exactly at right angles to one another, it may be possible to depart from exact orthogonal directions without departing from the scope of the invention.

Figure 1:
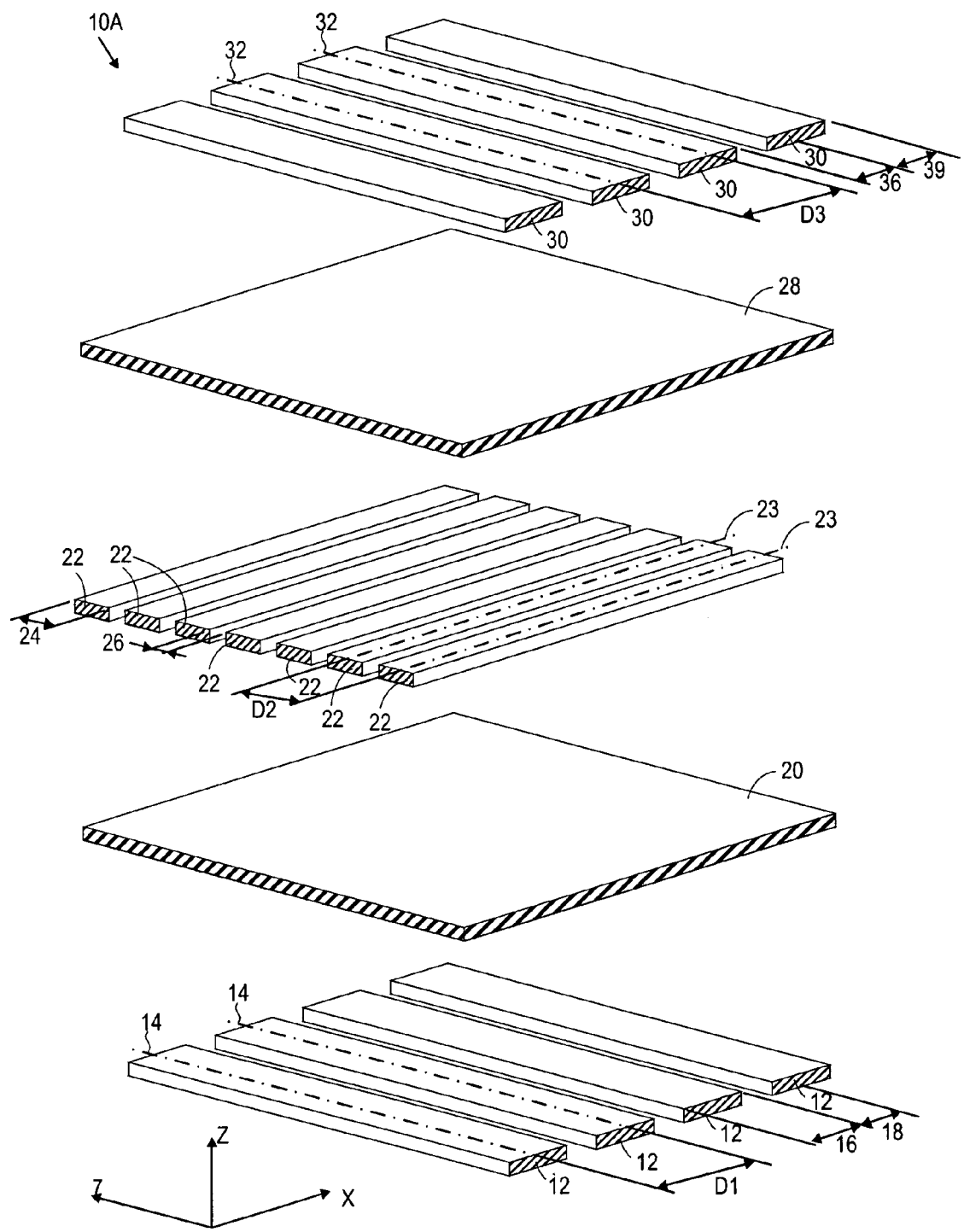
FIG. 1 is a perspective view illustrating one multi-layer construction of a polymer memory in exploded form.

FIG. 1 of the accompanying drawings illustrates a first multi-layer construction 10A of a polymer memory, according to an embodiment of the invention. One multi-layer construction of the polymer memory has two sets of word lines and a set of bit lines between the word lines. The word lines of each set of word lines have center lines that are spaced by a first distance from one another, and the bit lines have center lines spaced by a second distance from one another, the second distance being less than the first distance. Three masking steps are required to manufacture the three layers of lines. Older-technology machinery with wide-pitch masks is used to form the two layers of word lines, and new-technology machinery with narrow-pitch masks is used to manufacture the bit lines. As such, only 33% of the machinery has to be upgraded for manufacturing one multi-layer construction. The entire polymer memory has four multi-layer constructions having a total of 12 layers of lines, of which four layers require new-technology machinery. The multi-layer constructions are formed on underlying electronics. The underlying electronics are constructed utilizing 28 masking steps, 4 of the 28 masking steps requiring new-technology machinery. As such, the manufacture of the entire polymer memory requires 40 masking steps, 8 of which require new-technology machinery. A 20% machinery upgrade is thus required for manufacturing the entire polymer memory, which is generally regarded as acceptable when upgrading machinery from one generation to the next.

A first layer of conductive word lines 12 is formed from aluminum or another metal, and has center lines 14 extending in a y-direction. The center lines 14 are spaced from one another in an x-direction by a distance D1. Each word line 12 has a width 16, in the x-direction, approximately equal to D1/2. The word lines 12 are spaced from one another by a spacing 18, in the x-direction, approximately equal to D1/2.

A first ferroelectric polymer memory material 20 is formed on the word lines 12. The ferroelectric polymer memory material 20 forms a layer in an x-y plane. In another embodiment, the ferroelectric polymer memory material 20 may be formed at select locations to form, for example, an array in x- and y-directions.

A layer of conductive bit lines 22 are subsequently formed on top of the memory material 20, so that the memory material 20 spaces the bit lines 22 in a z-direction from the word lines 12. The bit lines 22 have center lines 23 extending parallel to one another in the x-direction. The center lines 23 are spaced in the y-direction from one another by a distance D2. Each bit line 22 has a width 24 in the y-direction approximately equal to D2/2. The bit lines 22 are spaced from one another in the y-direction by a spacing 26 approximately equal to D2/2.

A ferroelectric polymer memory material 28 is subsequently formed on top of the bit lines 22. As with the memory material 20, the memory material 28 forms a layer extending in an x-y plane.

A second layer of conductive word lines 30 is subsequently formed on top of the memory material 28. The memory material 28 spaces the word lines 30 in a z-direction from the bit lines 22. The word lines 30 have center lines 32 extending parallel to one another in the y-direction. The center lines 32 are spaced from one another in the x-direction by a distance D3. Each one of the conductive word lines 30 has a width 34 in the x-direction approximately equal to D3/2, and the word lines 30 are spaced from one another in the x-direction by a spacing 36 approximately equal to D3/2.

The word lines 30, in this example, fall exactly on the word lines 12, so that the center lines 32 fall on the center lines 14, the distances D3 and D1 are the same, the widths 34 and 16 are the same, and the spacings 36 and 18 are the same. The dimensions D1, 16, 18, D3, 34, and 36 are all relatively large. Because of the relatively large dimensions, a fabrication facility having existing, older-technology lithographic tools can be used to define the word lines 12 and 30.

The bit lines 22 are, however, formed more densely than the word lines 12 and 30. As such, the distance D2 is substantially smaller than the distance D1. The width 24 and spacing 26 are, accordingly, smaller than the width 16 and spacing 18. The more dense layouts of the bit lines 22 form a new-generation polymer memory, having a larger array of cells per unit area when compared to a preceding generation.

The bit lines 22 may be too dense to be manufactured utilizing the same tools used to manufacture the word lines 12 and 30. What should be noted, however, is that an equipment upgrade is only required to form the bit lines 22, and the equipment upgrades to form the two layers of word lines 12 and 30 is not required. The equipment upgrade for the first multi-layer construction is thus 33%.

Figure 2:
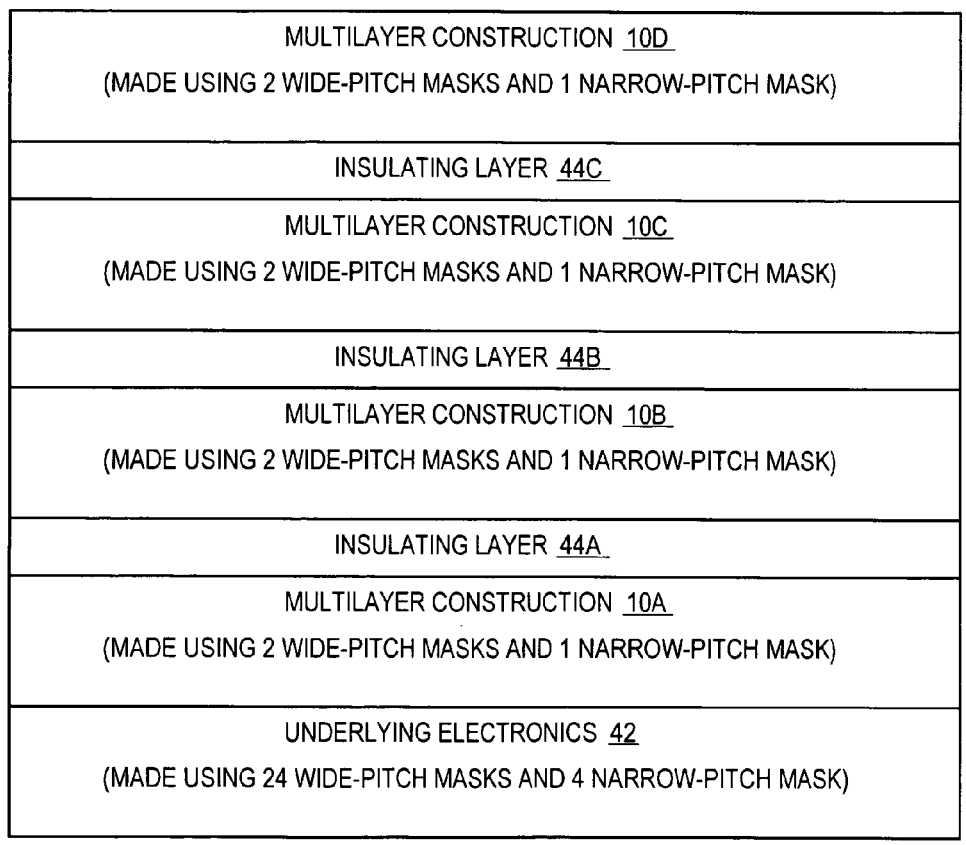
FIG. 2 is a block diagram illustrating various substructures of the polymer memory, including underlying electronics, the multi-layered construction of FIG. 1, and alternating insulating layers and further multi-layered constructions.

FIG. 2 illustrates the entire polymer memory 40, which includes underlying electronics 42, the first multi-layer construction 10A formed on an insulating layer of the underlying electronics 42, a first insulating layer 44A formed on the first multi-layer construction 10A, and second, third, and fourth multi-layer constructions 10B, 10C, and 10D, alternated by second and third insulating layers 44B and 44C. The underlying electronics 42 is made using 24 wide-pitch masks and four narrow-pitch masks, and related tooling. As hereinbefore described, the first multi-layer construction 10A is made using two wide-pitch masks and one narrow-pitch mask and related tooling. The second, third, and fourth multi-layer constructions 10B, 10C, and 10D are identical to the first multi-layer construction 10A, and are each made using two wide-pitch masks and one narrow-pitch mask. The polymer memory 40 is thus made using 40 masks, only eight of which are narrow-pitch masks. The equipment upgrade that is required is thus 20%, which is regarded as an acceptable percentage when advancing from one generation of computer integrated circuit product, in the present example a polymer memory product, to the next.

Figure 3:
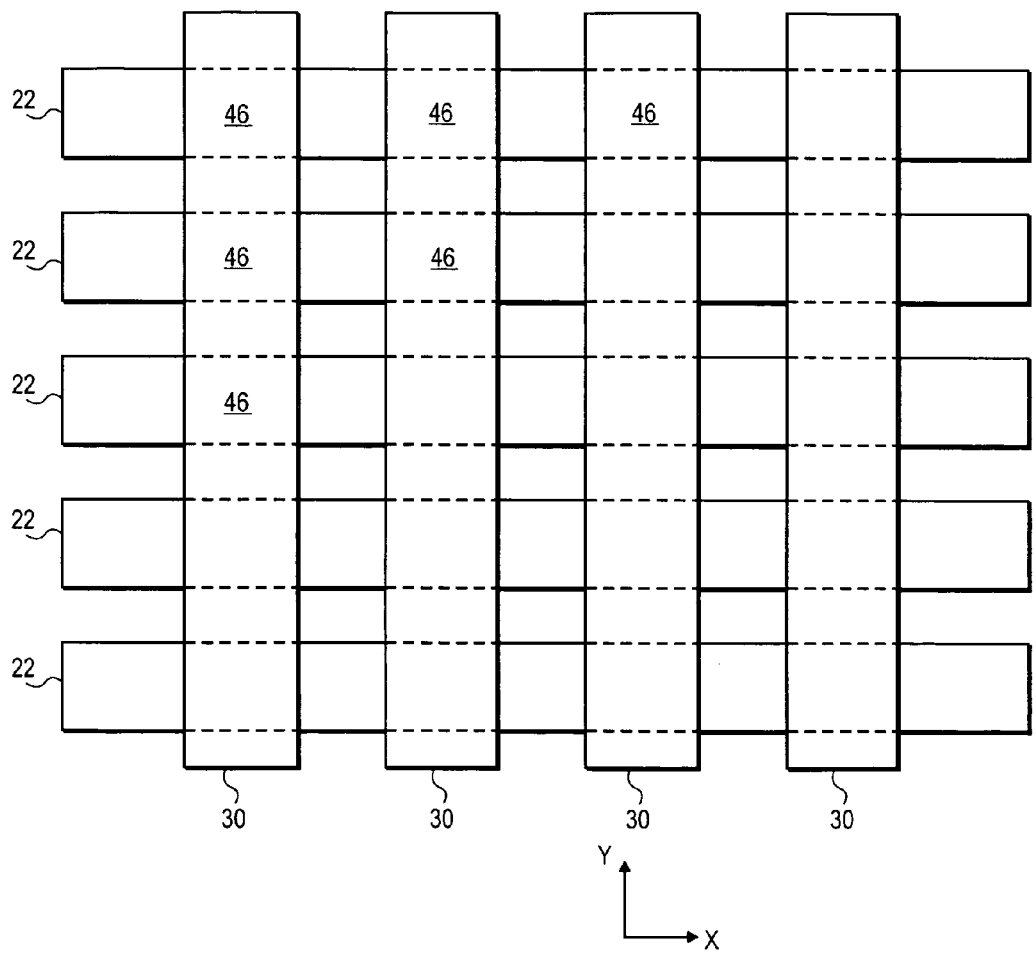
FIG. 3 is a top plan view illustrating an array of polymer memory cells that are defined by word and bit lines.

With reference to FIGS. 1 and 3, an array of polymer memory cells 46 is defined in the memory material 28, each polymer memory cell 46 at a location where a respective word line 30 crosses a respective bit line 22. Each polymer memory cell 46 has an asymmetric cell size with a width in the x-direction corresponding to the width 34 of one of the word lines 30, and a length in the y-direction corresponding to the width 24 of one of the bit lines 22. Another array of polymer memory cells, not illustrated in FIG. 3, is defined in the memory material 20, having polymer memory cells each where a respective one of the bit lines 22 crosses over a respective one of the word lines 12.

The memory material has a dipole with a moment that can be changed by applying a voltage over the memory material. A potential of +4.5 volts changes the orientation of the dipole moment from one direction to an opposite direction, and a potential of −4.5 volts can change the orientation of the dipole moment back to its original state. In such a manner, a "1" or a "0" can be written to the memory material.

Figure 4A:
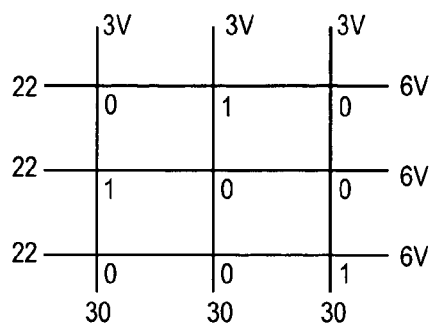

FIG. 4A illustrates the state of the word lines 30 and bit lines 22 just before writing a "1" to one of the polymer memory cells 46 between the word lines 30 and bit lines 22. Each one of the word lines 30 is at three volts, and each one of the bit lines 22 is then set to six volts. A voltage difference of three volts thus exists between each overlapping word and bit line 30 and 22.

Figure 4B:
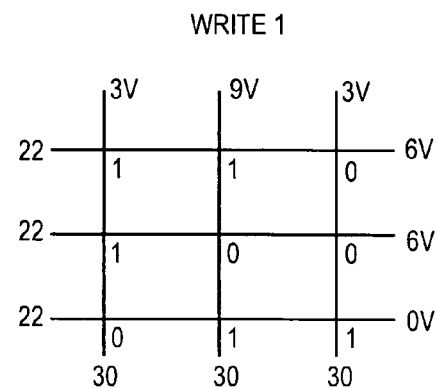

FIG. 4B illustrates how a "1" is then written to one of the polymer memory cells 46. The voltage on one of the word lines 30 is changed to nine volts, and the voltage on one of the bit lines 22 to zero volts. A voltage difference of nine volts (9 volts−0 volts) now exists over the respective word and bit lines 30 and 22. The voltage difference exceeds the 4.5 volts required to switch the polymer memory cell 46. Dipole moments align in a direction oriented as determined by the applied voltage, which is the way that a "1" is written to the polymer memory cell.

Figure 4C:
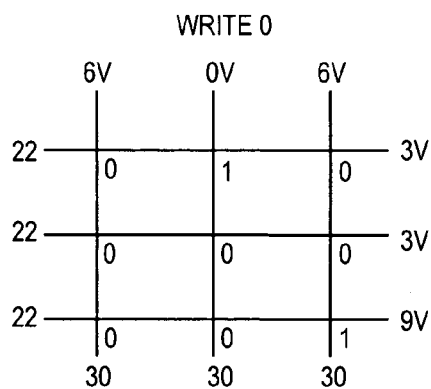

FIG. 4C illustrates how a "0" can be written to one of the polymer memory cells 46. First, all the voltages on all word and bit lines are set to 0 volts. Then, the voltages of all the bit lines are set to 3 volts. All the word lines are then set to 6 volts. The voltage on one of the word lines is changed to zero volts, and the voltage on one of the bit lines to 9 volts. A voltage difference of −9 volts (0 volts−9 volts) now exists over the respective word and bit lines 30 and 22. The voltage difference exceeds the −4.5 volts required to switch the polymer memory cell 46 to 0.

Figure 4D:
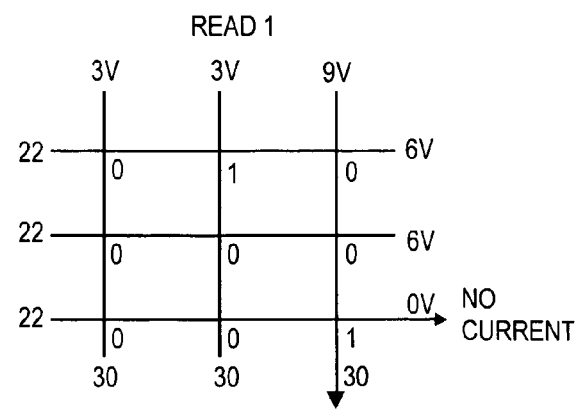

FIG. 4D illustrates how the state can be read from one of the polymer memory cells 46. Reading is a destructive write operation. First, the voltages on all the word lines are reset to 3 volts, and the voltages on all the bit lines to 6 volts. The voltage on one of the word lines is then switched to 9 volts, and one of the bit lines to zero volts, as in the situation illustrated in FIG. 4B, where a "1" is written to a cell. In FIG. 4D, a "1" already existed in the cell where the 1 is written, so that no current is detected on the bit line of the respective cell.

Figure 5:
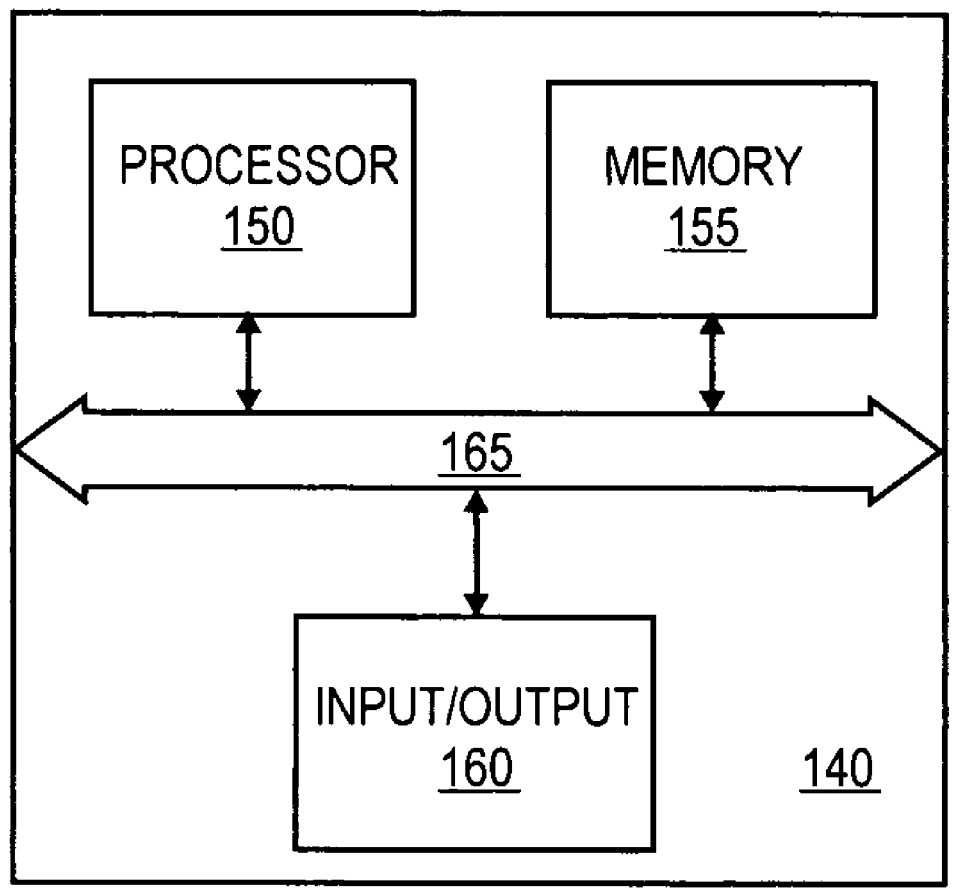
FIG. 5 is a block diagram of a computer system that may include the polymer memory of FIG. 2.

FIG. 5 illustrates a computer system 140 that may include the polymer memory 40 of FIG. 2. The computer system 140 includes a processor 150, memory 40, and input/output capability 160 coupled to a system bus 165. The memory 40 is configured to store instructions which, when executed by the processor 150, perform the methods described herein. The memory 40 may also store the input and currently edited video content. Input/output 160 provides for the delivery and display of the video content or portions or representations thereof. Input/output 160 also encompasses various types of computer-readable media, including any type of storage devices that is accessible by the processor 150. Such storage devices may include mass storage memory of the kind hereinbefore described with reference to FIG. 1. One of skill in the art will immediately recognize that the term "computer-readable medium/media" further encompasses a carrier wave that encodes a data signal. Input/output and related media 160 store the computer-executable instructions for the operating system and methods of the present invention, as well as the video content.

The description of FIG. 5 is intended to provide an overview of computer hardware and other operating components suitable for implementing the invention, but is not intended to limit the applicable environments. It will be appreciated that the computer system 140 is one example of many possible computer systems which have different architectures. A typical computer system will usually include at least a processor, memory, and a bus coupling the memory to the processor. One of skill in the art will immediately appreciate that the invention can be practiced with other computer system configurations, including multiprocessor systems, minicomputers, mainframe computers, and the like. The invention can also be practiced in distributed computing environments where tasks are performed by remote processing devices that are linked through a communications network.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of manufacturing a polymer memory, comprising:
   (i) forming a first plurality of conductive word lines extending parallel to one another in a y-direction and having center lines spaced from one another by a first distance in an x-direction;
   (ii) forming a first ferroelectric polymer memory material in x- and y-directions over the word lines;
   (iii) forming a plurality of conductive bit lines extending parallel to one another in the x-direction over the first ferroelectric polymer memory material and having center lines spaced from one another by a second distance in the y-direction, the second distance being less than the first distance, adjacent ones of the bit lines spaced from one another by a spacing that is approximately half the second distance, a first array of polymer memory cells being defined in the first ferroelectric polymer memory material, each where a respective bit line crosses over a respective one of the first plurality of word lines, such that the ferroelectric polymer memory material at a respective cell of the first array is changed when a select voltage difference is applied over respective word and bit lines on opposing sides of the respective cell.

2. The method of claim 1, further comprising:
   (iv) forming a second ferroelectric polymer memory material in x- and y-directions over the bit lines; and
   (v) forming a second plurality of conductive word lines extending parallel to one another in the y-direction over the second ferroelectric polymer memory material and having center lines spaced from one another by a third distance, equal to the first distance, in the x-direction, a second array of polymer memory cells being defined in the second ferroelectric polymer memory material, each where a respective one of the second plurality of word lines crosses over a respective bit line, such that the ferroelectric polymer memory material at a respective cell of the respective second array is changed when a select voltage difference is applied over respective bit and word lines opposing the respective cell.

3. The method of claim 2, wherein (i)-(v) form at least part of a multi-layer structure, further comprising:
   (vi) forming an insulating layer over the second plurality of word lines; and
   (vii) repeating (i)-(v) on the insulating layer.

4. The method of claim 2, wherein each word line has a first width in the x-direction and each bit line has a second width in the y-direction, the second width being less than the first width.

5. The method of claim 4, wherein adjacent ones of the word lines are spaced from one another by a first spacing in the x-direction and adjacent ones of the bit lines are spaced from one another by a second spacing in the y-direction, the first spacing being more than the second spacing.

* * * * *